United States Patent [19]

Rinderle

[11] Patent Number: 4,580,288
[45] Date of Patent: Apr. 1, 1986

[54] RECEIVER INPUT CIRCUIT

[75] Inventor: Heinz Rinderle, Heilbronn, Fed. Rep. of Germany

[73] Assignee: Telefunken Electronic GmbH, Heilbronn, Fed. Rep. of Germany

[21] Appl. No.: 478,522

[22] Filed: Mar. 22, 1983

[30] Foreign Application Priority Data

Mar. 22, 1982 [DE]  Fed. Rep. of Germany ....... 3210454

[51] Int. Cl.[4] .............................................. H04B 1/26
[52] U.S. Cl. ................................... 455/239; 455/247; 455/249
[58] Field of Search ................ 455/239, 241, 242, 243, 455/246, 247, 249, 250, 234, 200, 197

[56] References Cited

U.S. PATENT DOCUMENTS

| 2,112,279 | 3/1938 | Hagenhaus | 455/247 |
|---|---|---|---|
| 3,611,154 | 10/1971 | Kupfer | 455/197 |
| 3,619,786 | 11/1971 | Wilcox | 455/249 |
| 3,895,299 | 7/1975 | Tiedeman, Jr. | 455/249 |
| 4,030,035 | 6/1977 | Ienaka | 455/246 |

FOREIGN PATENT DOCUMENTS 673988   4/1939   Fed. Rep. of Germany .
2543853 12/1977  Fed. Rep. of Germany .

OTHER PUBLICATIONS

"Semiconductor Circuitry Examples" Siemens Publication 1972/1973 pp. 38–43.

Primary Examiner—Marc E. Bookbinder
Attorney, Agent, or Firm—Spencer & Frank

[57] ABSTRACT

A receiver input circuit comprising a control loop for amplification control, wherein the control signal for the control loop is derived from the intermediate frequency signal and supplied to the part of the circuit preceding the mixer stage. The receiver input circuit furthermore comprises a second amplification control loop whose control signal is taken out prior to the mixer stage, and a third amplification control loop whose response threshold and frequency band width are lower than the response threshold and frequency band width of the first and second control circuits.

17 Claims, 6 Drawing Figures

RECEIVER INPUT CIRCUIT

BACKGROUND OF THE INVENTION

Receiver input circuits comprising a preamplifier arrangement followed by a mixer arrangement which are connected to one another by adjustable selection means and whose total amplification is controlled and regulated in dependence upon signal input are used, for example, in input circuits for radio and television receivers. With these circuits, it is a question of arriving at a favorable compromise between small and large signal behavior, on the one hand, and low production cost, on the other hand. In the known circuits, this problem is mainly dealt with by appropriate selection of the active semiconductor components and by amplification control. This problem is caused by the limited dynamic characteristics of the passive and active semiconductor components such as bipolar transistors, field-effect transistors and diodes, including tuning diodes.

The Siemens publication "Semiconductor Circuitry Examples" 1972/73, pages 38 to 43, describes circuitry examples for TV tuners dealing with the above-mentioned problem. The block wiring diagram on page 39 of this publication shows, for example, the set-up of a VHF/UHF input section for a TV receiver with an input high-pass filter, followed by a PIN control network, antenna filter for VHF and UHF input sections, uncontrolled preamplifier stages for VHF and UHF and also, for example, band filters tuned with varactor diodes between preamplifier and following mixer stage. Amplification control is effected from a higher input signal level via the PIN diode control network, with the control signal being taken from the IF section of the receiver. This type of amplification control serves to protect the semiconductor components, in this case, bipolar transistors and varactor diodes, from stronger signal drives causing distortions. The basic advantage of such amplification control with PIN diodes lies in the fact that the PIN diodes of the control network themselves cause practically no distortions at all. In the known circuit, however, the noise level increases to the same extent as the control attenuation, causing control actuation to be moved to as high as possible signal levels in order to reach a sufficiently high S/N ratio level with stronger signals at all. In the known circuit, the preamplifier transistor itself is used for amplification control. Here, amplification is lowered by upward control of the collector current of this transistor. The disadvantage of such amplification control is, however, that it entails a non-linearity, dependent on the control condition and partly quite strong, which, in turn, causes signal distortions, inter alia, cross modulation and intermodulation.

Another Siemens publication "Semiconductor Circuitry Examples" 1973/74, page 34, describes a circuit arrangement for the input section of an FM radio receiver with electronically tunable selective circuits. Here, too, amplification control is effected by means of a PIN diode control network between antenna input and the first selective circuit. In this example, the control signal is taken from the IF signal at the output of the circuit, in which case it is recommended to set the control so as to engage only from approximately 1 mV usable signal in order to obtain the maximum S/N ratio level. This type of control serves to prevent overloading of the circuit due to negative outside influences. In the known circuit, the control signal is obtained, relative to the transmission band width, in a narrow band from the signal input to the mixer. This involves the danger of overloading the preliminary and mixer stages with strong signals to which the circuit is not tuned. The mixer stage is particularly endangered here if no or only insufficient amplification step-down control is possible because of the narrow band in which the control signal is gained, and if one or several strong signals reach the mixer stage, amplified or hardly attenuated because of large HF band width and corresponding low selectivity. However, the varactor diodes used in electronic tuning also cause negative influences if they are subjected to strong signals. They themselves then cause cross modulation and intermodulation, for example, and, at certain signal levels and frequencies, can even occasion relaxation oscillations, combined with a strong modulation of the usable signals.

This effect is caused by the dynamic change in the average capacity of the varactor diodes with increasing applied signal voltage. The varactor diodes at the output of the preamplifier stage are affected most, if, as explained above, the preamplifier stage has not or only insufficiently been subjected to step-down control. Even if no relaxation oscillations appear, mistuning of the preselection circuits may occur in the case of a received weak usable signal due to the dynamic capacity changes in the varactor diodes, weakening the usable signal reaching the mixer and thus deteriorating the S/N ratio of the usable signal received. This preselection problem with varactor diodes as tuning reactances is aggravated if it is attempted, under otherwise approximately identical conditions, to obtain a high level of preselection, i.e., trimming the preselection circuits to a high level of resonance quality, a measure which, for instance, appears desirable in view of the large signal characteristics caused by the mixer stage. Such a measure would, on the other hand, intensify possible interference effects, for with identical signal power, a greater signal voltage occurs at the varactor diodes owing to the higher resonance quality.

SUMMARY OF THE INVENTION

It is an object of the invention to provide a receiver input circuit which enables substantial elimination of an undesired signal actuation of the non-linear components in the signal path resulting in distortions, taking into account an adequate small signal behavior and using conventional components. According to the invention, there is provided in a receiver input circuit comprising a control loop for amplification control, with the control signal for the control loop being derived from the intermediate frequency signal and supplied to the part of the circuit preceding the mixer stage, in addition to a second amplification control loop whose control signal is taken out prior to the mixer stage, a third amplification control loop whose response threshold and frequency band width are lower than the response threshold and frequency band width of the first and second control circuits.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
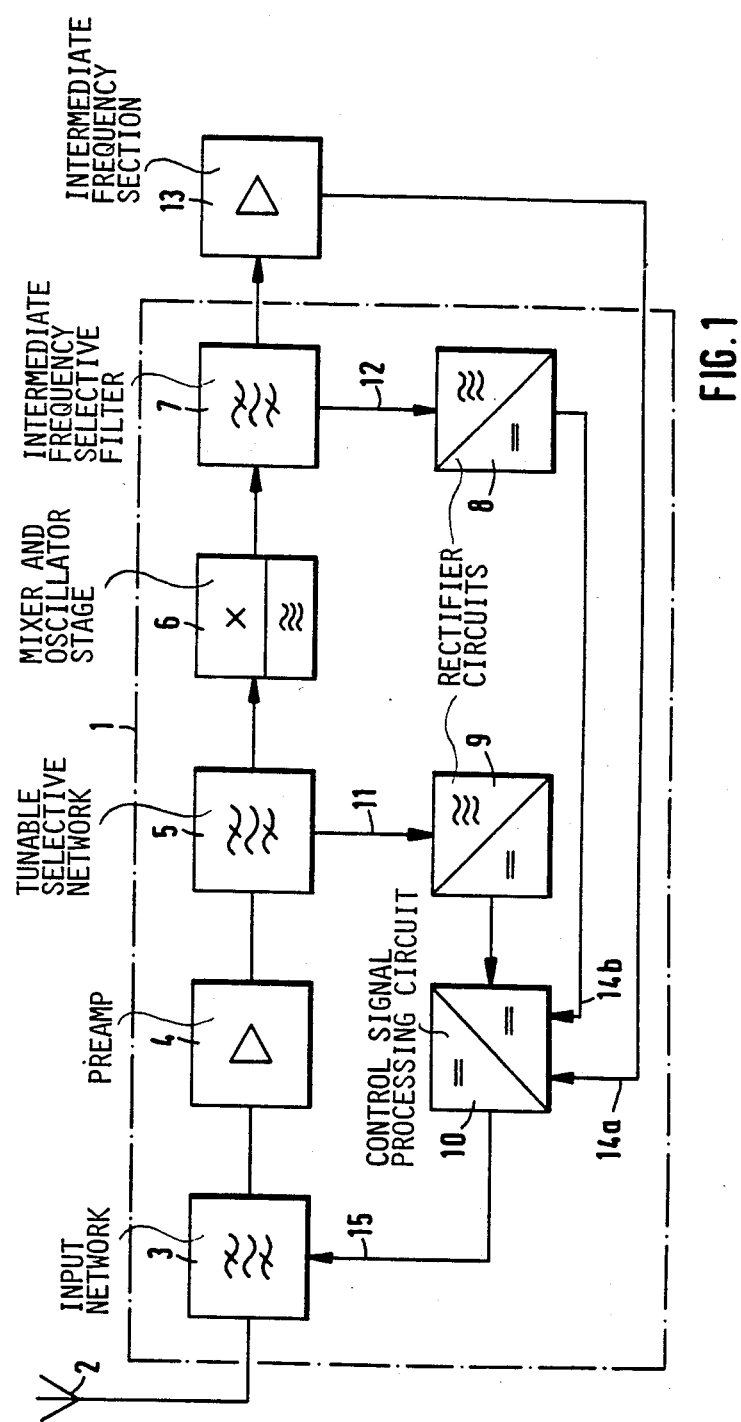
FIG. 1 shows the principle underlying the invention, with several amplification control circuits.

FIG. 1 shows the principle underlying a receiver input circuit 1 according to the invention with the usual functional parts such as preamplifier 4, tunable selective network 5, mixer and oscillator stage 6 and intermediate frequency selective filter 7, from which the preselected intermediate frequency signal is taken and then fed to the intermediate frequency section 13 of the receiver. The use of several amplification control circuits according to the invention is shown in FIG. 1, i.e., two control circuits within the input circuit 1 and an outer control circuit which includes the intermediate frequency amplifier 13. The control signal for the first control circuit is obtained at the output of the preamplifier stage (control signal line 11), for the second control circuit at the output of the mixer stage (control signal line 12), and for the third control circuit in the signal frequency selective intermediate frequency amplifier 13. Amplification is controlled jointly in the input network 3 by means of the control signal 15 processed in the control signal processing circuit 10. The high frequency signal voltages are converted into direct signals for the first and second control circuit in the rectifier circuits 9 and 8, respectively.

The positive effect of the circuit according to the invention is already obtained from the use of the first and second control loop. These fulfill the following tasks and they are arranged as follows:

(a) first amplification control circuit

Avoidance of unwanted overloading of the mixer stage and/or the varactor diodes which may be used in the tunable network 5, if the second control circuit is inactive. The effective band width is approximately identical with the transmission band width of the network 5 (HF selective filter) and the signal response threshold for control application is below the modulation limit for the mixer input or—if applicable—the varactor diodes of the selective filter 5. The maximum response threshold is determined by the fact that no relaxation oscillations or control oscillations occur in the given frequency and level range, even if its amplitude is modulated.

(b) second amplification control circuit

Avoidance of overloading of the mixer stage (also on the output side) as well as frequency influences acting upon the oscillator because of powerful usable signals to which the receiver is tuned, or by means of spurious signals in close proximity to the frequency.

The effective band width is less than that of the first control circuit but greater than that of the third control circuit and it corresponds approximately to the selective characteristics of the intermediate frequency filter 7. The signal response threshold is set lower than that of the first control circuit.

In a first further embodiment of the invention, the third amplification control circuit can be used to support the other control circuits, in which case the effective band width and the signal response threshold are lower than for the second control circuit.

In a second further embodiment of the invention, the response threshold of the third control circuit may be controlled by the control signal, preferably of the second control circuit, in such a way that the signal response threshold is reduced by it from a certain spurious signal level on. This enables the amplification of the circuit to be lowered even in the case of a small usable signal, thus affording better protection of the input circuit from the negative influences of stronger spurious signals, which is expedient and harmless if the signal noise ratio of the usable signal received were impaired by stronger spurious signals anyhow, caused, e.g., by the phase noise of the input oscillator.

Figure 2:
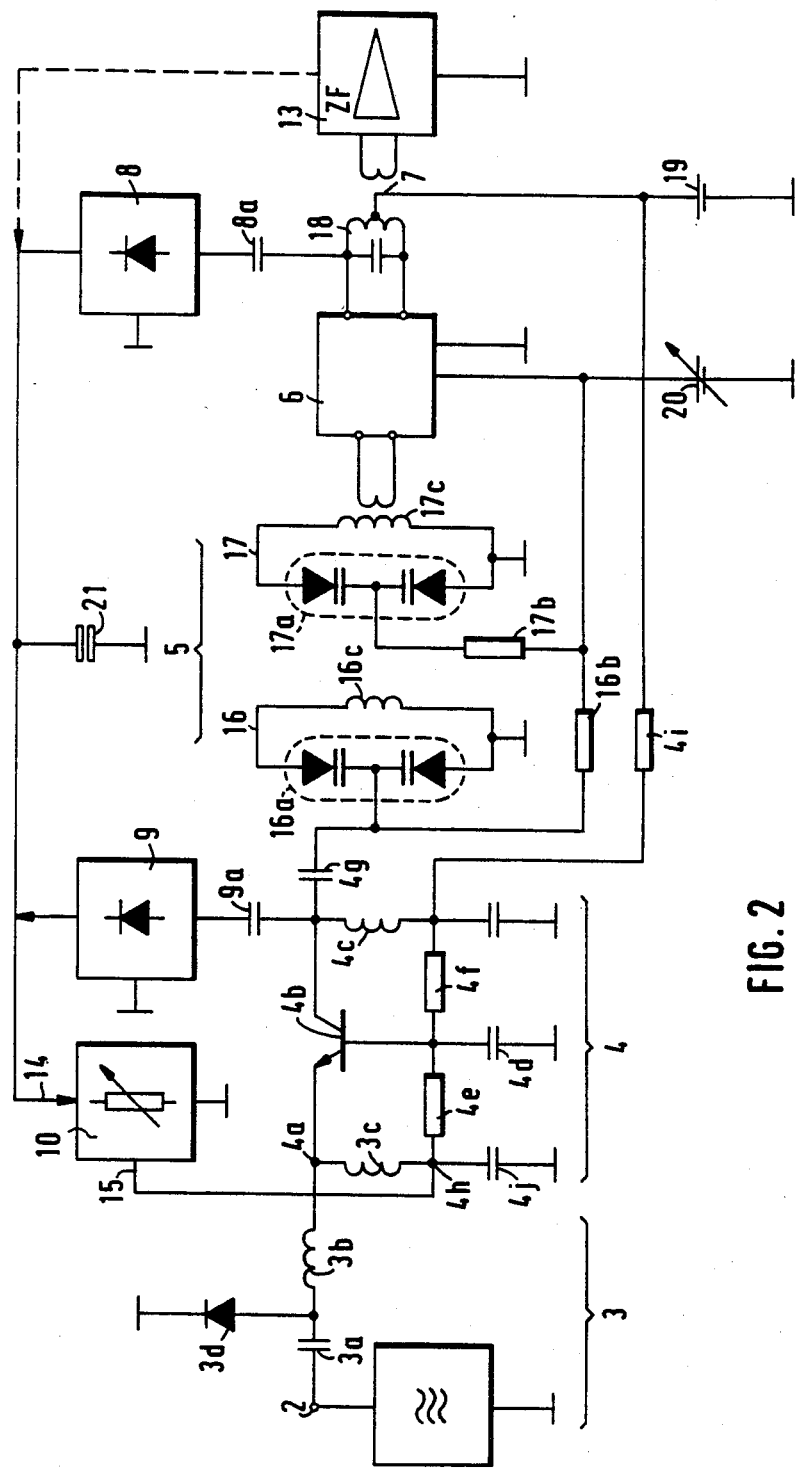
FIG. 2 is an embodiment of a receiver input circuit.

An embodiment of the input circuit according to the invention is shown in FIG. 2. This includes the input network 3 with the three reactance elements (3a, 3b, 3c) and a PIN diode 3d for controllable signal attenuation, the preamplifier stage 4 with a bipolar transistor 4b in grounded-base circuits 16 and 17, the mixer and oscillator stage 6, the intermediate frequency filter 7 with the resonant circuit 18, the rectifier circuits 8 and 9 and the control signal processing circuit 10.

The signal-dependent direct signals obtained in the rectifier circuits 8 and 9 are smoothed by a capacitor 21 and directed to a controlled shunt resistor in the circuit section 10 as a control signal. The shunt resistor located between the circuit point 4h and reference potential controls the direct current flowing to the PIN diode 3d, with the sum of the currents through the shunt resistor and through the PIN diode 3d being identical to the operating current of the preamplifier stage 4. Control of the PIN diode (amplification control member) is thus effected by the distribution of the operating current determined by the shunt resistor to the PIN diode and the shunt resistor. This type of amplification control has the advantage that the operating current of the total circuit hardly changes at all during amplification control and that there is no substantial additional control power requirement. A further advantage of this type of amplification control with the almost constant operating power during control lies in that in the case of integration of the control circuit with other circuit sections there are no substantial temperature changes in the integrated circuit during the control procedure. The advantage of PIN diode control in the input network 3 in front of the first distortion-forming member (4b) is that all distortion-forming circuit components can be protected against signal overloading during control. The control circuit according to the invention based on a PIN diode also has the advantage that the following amplifier component is protected against high-voltage discharge surges from the antenna.

Since rectifier circuits are generally the source of signal distortions themselves (e.g. intermodulation) it is expedient to arrange rectifier circuits 8 and/or 9 in such a way that the signal distortions which may occur do not affect the input circuit. This may be achieved, for example, by means of a buffer amplifier or amplifier component which is arranged between the signal voltage to be rectified and the rectifier circuit causing the distortions.

In several applications it is expedient to effect the levelling of the control signal by the capacitor 21 in such a manner that the capacitor 21 quickly charges itself up to the amount corresponding to the highest value of the signal level and follows the decreasing signal level relatively slowly. This enables greater elimination of interference through the control circuit if powerful amplitude-modulated spurious signals are present and there is danger of overloading due to peak amplitudes, and this danger cannot be avoided by a control circuit which only reacts to the arithmetical mean value.

Figure 3:
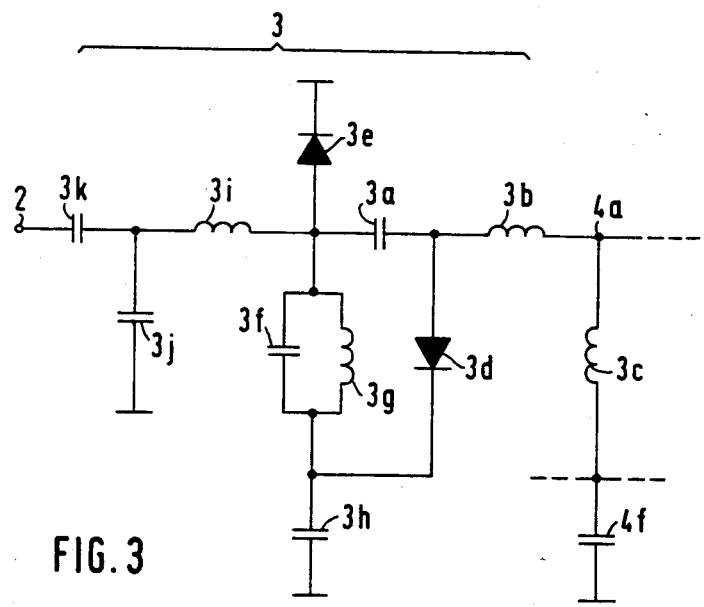
FIG. 3 is an embodiment with an extended, permanently tuned input network.

In a further development of the input network according to FIG. 3, the use of a second PIN diode 3e and an extended reactance network with the additional reactances 3f to 3k is illustrated. Here the PIN diodes act in series with respect to direct current and attenuate, on the one hand, the series-resonance of the reactance combination 3a, 3b with increasing control current flow, and, on the other hand, the parallel resonance of the parallel-resonant circuit formed by the reactances 3f and 3g. The series and parallel-resonant frequency, respectively, of the reactance combinations mentioned are identical to the center frequency of the signal frequency band to be transmitted. The capacitors 3h and 4f act practically as short circuits for the signal frequency. With the reactance 3j in the given example, a stepdown transformation of the signal source resistance connected to contact 2 to the amplifier component 4b (contact 4a) is obtained. The advantage of this input network in comparison to the one shown in FIG. 2 lies in the greater obtainable control range as well as the greater selectivity of the input circuit compared to the adjacent signal frequency bands.

Figure 4:
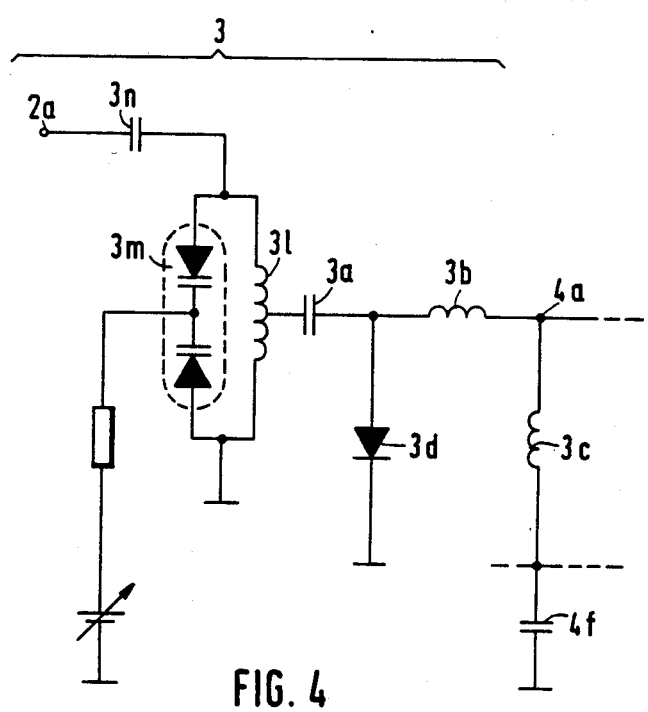
FIG. 4 is an embodiment with an extended, tunable input network.

FIG. 4 shows a further development of the input network. Compared to the network of FIG. 1, there is a tunable selective circuit with elements 3e to 3n connected between the terminal 2 and the signal input terminal 2a. This circuit has the advantage of higher selectivity while simultaneously avoiding strong attenuation of the tunable selective circuit during control. The desired source impedance for actuation of the preamplifier transistor in the uncontrolled condition is adjusted, for example, by selection of the tapping of reactance 3e or by a correspondingly dimensioned coupling coil. All input network circuits according to FIGS. 2 to 4 have in common the fact that during control (signal attenuation at the input) the source impedance for the preamplifier transistor 4b operating in grounded-base circuit increases. The control effect is thus amplified by means of the simultaneously increasing negative current feedback without a substantial increase of the noise level during control. This is achieved by the PIN diode, whose resistance is controlled, acting at the connecting point of the reactances 3a and 3b.

Figure 5:
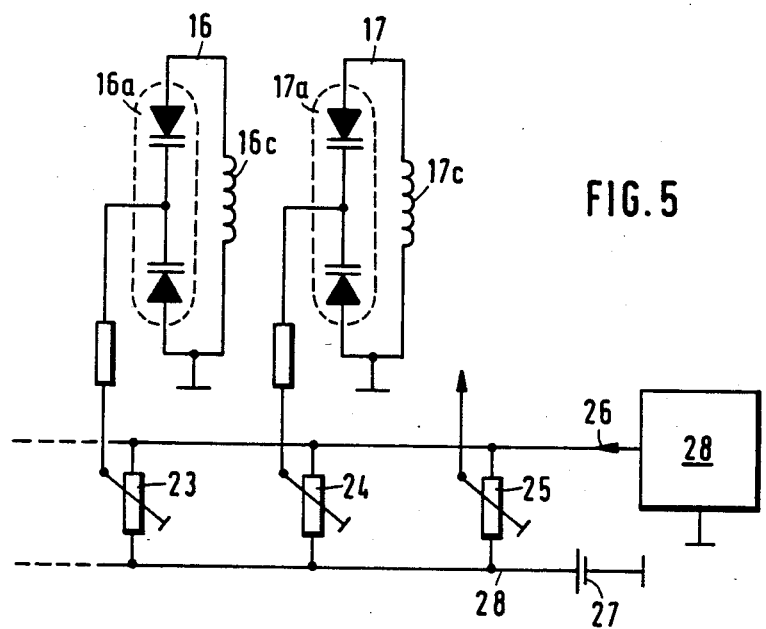
FIG. 5 is an embodiment for the iteration-free alignment of the tuned circuits.

FIG. 5 shows the tunable network in an embodiment of the invention in which the network 5, tunable by means of varactor diodes, with the resonant circuits 16 and 17 and the oscillator circuit, has a separate supply and adjustment of the tuning voltage for the varactor diodes. This circuit permits an iteration-free alignment of all tunable tuning circuits of the receiver input circuit. The circuit operates as follows:

The manipulated variable generated by the tuning voltage generator 28 (e.g. a PLL circuit) is aligned to the minimum given tuning voltage 27 at minimum given tuning frequency by means of the oscillator circuit coil. Following this, coils 16c and 17c are aligned to maximum amplification of the receiver input section at minimum signal frequency (L alignment). At the upper tuning frequency and signal frequency of the transmitting band this is followed by the so-called C alignment by means of the potentiometers 23, 24 and 25 in the following sequence: 25 (adjusting the upper tuning voltage) and 23 and 24 (maximum amplification). In an embodiment of the invention, one of the voltage dividers for the alignment may also be fixed voltage divider such as the divider 25 for the oscillator circuit, for example. The C alignment of the resonant circuits 16 and 17 with respect to one another is required if the varactor diodes do not possess a sufficiently identical C (U) characteristic. This is also true in the event that individual diodes are used instead of the twin diodes indicated in FIG. 5.

Figure 6:
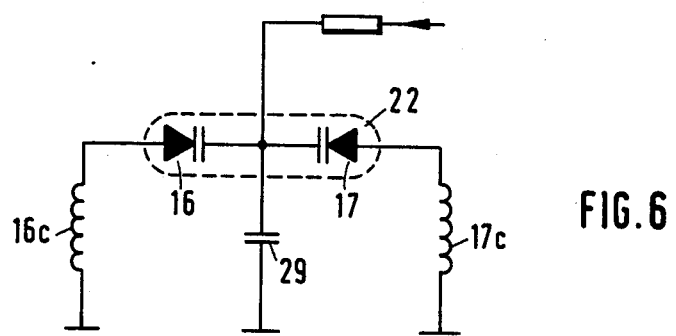
FIG. 6 is an embodiment for the common tuning of a two-circuit filter with a twin varactor diode.

FIG. 6 shows an embodiment of the tunable network 5 with one single twin diode which forms the resonant circuit 16 and 17, respectively, with the inductance 16c and 17c, respectively, and which is supplied by a single common tuning voltage. Coupling the resonant circuits is carried out inductively in this case, with the capacitor 29 constituting in the main an HF short circuit. The advantage of this embodiment of the tunable network consists in the fact that a high degree of identity of the C (U) characteristic of the varactor diodes can be expected. In this case, separate adjustment of the tuning voltage is not necessary.

What is claimed is:

1. A receiver comprising an input circuit defining a signal processing path having an input end for receiving a signal and an output end and including, in series between said input end and said output end, an input network having a controllable gain for controlling the amplitude of the received signal, a mixer stage for deriving an intermediate frequency signal from the signal provided by said input network, a tunable network, for signal preselection, connected between said input network and said mixer stage, a preamplifier stage between said tunable network and said input network, and an intermediate frequency selective filter having an input connected directly to said mixer stage, said input circuit further comprising a first amplification control circuit connected to derive a first control signal from the intermediate frequency signal at said input of said intermediate frequency selective filter, a second amplification control circuit connected to derive a second control signal from the output of said preamplifier stage, and means connected for supplying the first and second control signals to said input network for varying the gain of said input network inversely with variations in either control signal.

2. A receiver as defined in claim 1, wherein said input circuit comprises components which are in danger of being overloaded and the input network is positioned in the signal processing path in front of said components.

3. A receiver as defined in claim 1, wherein said first and second amplification control circuits have respectively different signal response thresholds.

4. A receiver as defined in claim 1, wherein the control circuits have different frequency band widths at which they are effective.

5. A receiver as defined in claim 1, wherein the frequency band width of the second control circuit is larger than the frequency band width of the first control circuit.

6. A receiver as defined in claim 3, wherein the response threshold of the second control circuit is higher than the response threshold of the first control circuit.

7. A receiver as defined in claim 1, wherein PIN diodes (3d) are provided for the controlling of the amplification.

8. A receiver as defined in claim 7, wherein the controlling current for the PIN diodes is derived from the operating current of said preamplifier stage (4).

9. A receiver as defined in claim 1, wherein said preamplifier stage comprises an amplifier component constituted by a transistor (4b) in grounded-base circuit.

10. A reciever as defined in claim 1, wherein said first and second control circuits each comprise a respective rectifier circuit (8, 9) of such configuration as to, as far as possible, not cause any signal distortions in the signal path of the input circuit.

11. A receiver as defined in claim 1, wherein said tunable network comprises tunable resonant circuits containing varactor diodes for tuning said resonant circuits.

12. A receiver as defined in claim 11 wherein said tunable network further comprsies voltage dividers connected to said tunable resonant circuits for aligning said tunable resonant circuits.

13. A receiver as defined in claim 11 wherein said tunable network further comprises a tuning voltage generator and a voltage source and each of said voltage dividers is connected between said tuning voltage generator and said voltage source.

14. A receiver as defined in claim 13 wherein each of said tunable resonant circuits is tunable in response to a tuning voltage having a selected minimum value, and said voltage source is arranged to produce a voltage identical to the selected minimum value.

15. A receiver as defined in claim 1 wherein said tunable network comprises two tunable resonant circuits and a twin varacter diode connected for tuning said tunable resonant circuits.

16. A receiver comprising an input circuit defining a signal processing path having an input end for receiving a signal and an output end and including, in series between said input end and said output end, an input network having a controllable gain for controlling the amplitude of the received signal, and a mixer stage for deriving an intermediate frequency signal from the signal provided by said input network, said input circuit further comprising a first amplification control circuit connected to derive a first control signal from the intermediate frequency signal from said mixer stage, a second amplification control circuit connected to derive a second control signal from a point in said signal processing path proceding said mixer stage, and means connected for supplying the first and second control signals to said input network for varying the gain of said input network inversely with variations in either control signal, wherein said gain varying means comprise means for causing said first and second control signals to act on said input network with a first time constant when said control signals vary in a direction to increase the gain of said input network and with a second time constant which is shorter than the first time constant when said control signals vary in a direction to reduce the gain of said input network.

17. A receiver comprising an input circuit defining a signal processing path having an input end for receiving a signal and an output end and including, in series between said input end and said output end, an input network having a controllable gain for controlling the amplitude of the received signal, and a mixer stage for deriving an intermediate frequency signal from the signal provided by said input network, said input circuit further comprising a first amplification control circuit connected to derive a first control signal from the intermediate frequency signal from said mixer stage, a second amplification control circuit connected to derive a second control signal from a point in said signal processing path preceding said mixer stage, and means connected for supplying the first and second control signals to said input network for varying the gain of said input network inversely with variations in either control signal, wherein said preamplifier stage comprises an amplifier component constituted by a transistor in grounded-base circuit, and a reactance network comprising PIN diodes operatively associated with said transistor for increasing the source impedance of said transistor when the control signals vary in a direction to reduce the gain of said input network.

* * * * *